(12) United States Patent
Yan et al.

(10) Patent No.: US 10,795,056 B2
(45) Date of Patent: Oct. 6, 2020

(54) LOCAL WEATHER FORECAST

(71) Applicant: Tianjin Kantian Technology Co., Ltd., Tianjin (CN)

(72) Inventors: Simeng Yan, Fremont, CA (US); Juntao Xiao, Sunnyvale, CA (US)

(73) Assignee: Tianjin Kantian Technology Co., Ltd., Tianjin (CN)

( * ) Notice: Subject to any disclaimer, the term of this patent is extended or adjusted under 35 U.S.C. 154(b) by 199 days.

(21) Appl. No.: 15/863,360

(22) Filed: Jan. 5, 2018

(65) Prior Publication Data

US 2018/0372914 A1 Dec. 27, 2018

Related U.S. Application Data

(60) Provisional application No. 62/524,376, filed on Jun. 23, 2017.

(51) Int. Cl.
| | | |
|---|---|---|
| *G01W 1/10* | (2006.01) | |
| *G06N 3/08* | (2006.01) | |
| *G06K 9/62* | (2006.01) | |
| *G06N 3/04* | (2006.01) | |
| *G06N 20/10* | (2019.01) | |
| *G06F 30/20* | (2020.01) | |
| *G01W 1/00* | (2006.01) | |
| *G06K 9/00* | (2006.01) | |

(52) U.S. Cl.
CPC ............... *G01W 1/10* (2013.01); *G06F 30/20* (2020.01); *G06K 9/6256* (2013.01); *G06N 3/0454* (2013.01); *G06N 3/08* (2013.01); *G06N 20/10* (2019.01); *G01W 2001/006* (2013.01); *G06K 9/0063* (2013.01)

(58) Field of Classification Search
CPC ... G01W 1/10; G01W 2001/006; G06N 20/10
See application file for complete search history.

(56) References Cited

U.S. PATENT DOCUMENTS

| | | |
|---|---|---|
| 5,848,378 A | 12/1998 | Shelton et al. |
| 5,963,670 A | 10/1999 | Lipson et al. |
| 6,961,061 B1 | 11/2005 | Johnson et al. |
| (Continued) | | |

OTHER PUBLICATIONS

International Patent Application No. PCT/US2018/038611; Int'l Search Report and the Written Opinion; dated Aug. 30, 2018; 7 pages.

(Continued)

*Primary Examiner* — Mohamed Charioui
(74) *Attorney, Agent, or Firm* — BakerHostetler

(57) ABSTRACT

Techniques for local weather forecast using a local weather forecast model are described herein. The disclosed techniques include generating data indicative of future weather conditions for a plurality of locations based at least on future forecast data provided by an existing forecast provider and a correlation between data collected by a plurality of data collection devices and historical data provided by the existing forecast provider. The disclosed techniques also include temporally and spatially interpolating the generated data and obtaining higher-frequency future weather forecast data for the plurality of locations and local weather forecast data for other locations than the plurality of locations.

20 Claims, 12 Drawing Sheets

(56) References Cited

U.S. PATENT DOCUMENTS

| | | | |
|---|---|---|---|
| 7,062,066 B2* | 6/2006 | Wolfson | G01S 13/86 |
| | | | 382/100 |
| 7,084,775 B1* | 8/2006 | Smith | G01W 1/00 |
| | | | 340/601 |
| 9,616,897 B2* | 4/2017 | Powers | B60W 40/06 |
| 2009/0208106 A1 | 8/2009 | Dunlop et al. | |
| 2009/0226033 A1 | 9/2009 | Sefcik | |
| 2010/0100328 A1 | 4/2010 | Moore et al. | |
| 2012/0330549 A1 | 12/2012 | Dannevik et al. | |
| 2013/0004096 A1 | 1/2013 | Goh et al. | |
| 2013/0117608 A1 | 5/2013 | Kirby | |
| 2015/0212236 A1* | 7/2015 | Haas | G01W 1/10 |
| | | | 382/100 |
| 2015/0261803 A1 | 9/2015 | Song et al. | |
| 2015/0332127 A1 | 11/2015 | Zheng et al. | |
| 2016/0291203 A1 | 10/2016 | Penta et al. | |

OTHER PUBLICATIONS

International Patent Application No. PCT/US2016/64122; Int'l Search Report and the Written Opinion; dated Feb. 15, 2017; 18 pages.
Nelder et al.; "A Simplex Method for Function Minimization"; The Computer Journal; vol. 7 Issue 4; 1965; p. 308-313 (published before this application Dec. 2015).

* cited by examiner

Cloud Type:
Cumulus - 21%
Stratocumulus - 66%
Cirrus - 13%
Other Types - 0%

LOCAL WEATHER FORECAST

CROSS REFERENCE TO RELATED APPLICATION

This application claims priority to U.S. Provisional Patent Application No. 62/524,376 filed Jun. 23, 2017, the entire contents of which are hereby incorporated by reference.

BACKGROUND

Conventional weather forecasters have a variety of tools to obtain weather information, such as weather stations and weather satellites. Weather stations can collect numerical data of wind speed, air temperature, air pressure, and so on. Weather satellites can show cloud formations and large-scale weather events, such as hurricanes. Even so, weather stations are spread miles apart, and typically limited to gather numerical data. Weather satellites are positioned thousands of miles above the earth, and limited to view large-scale weather events. Subject to various limitations, current weather forecasts' accuracy cannot fulfill needs of people. For example, outdoor enthusiasts or avid travelers need accurate and local weather information to arrange their outdoor or travelling plans. Likewise, business people need precise and local weather forecasts to optimize processes and decrease weather-related economic risks.

BRIEF DESCRIPTION OF DRAWINGS

The following detailed description may be better understood when read in conjunction with the appended drawings. For the purposes of illustration, there are shown in the drawings example embodiments of various aspects of the disclosure; however, the invention is not limited to the specific methods and instrumentalities disclosed.

DETAILED DESCRIPTION

Techniques for local weather forecast are described herein. In accordance with the present disclosure, economical data collection devices may be installed in any places on the earth, and form a dense network of data collection devices. Preferably, these data collection devices include image capture components for capturing series of sequential images over time and a plurality of sensors for measuring various weather parameters. The captured images and the measured data are associated with their corresponding locations and timestamps.

The disclosed techniques include training a local weather forecast model using information extracted from images captured by a plurality of data collection devices, data measured by the sensors of the plurality of data collection devices, and historical weather forecast data provided by an existing forecast provider. Information indicative of cloud type, cloud moving direction and cloud cover is extracted from the images captured by the plurality of data collection devices. In some embodiments, a deep learning algorithm is trained using pre-labelled information relating to a plurality of cloud types. The trained deep learning algorithm is capable of recognizing cloud types.

The local weather forecast model is based at least on a correlation between data measured by or extracted from the plurality of data collection devices and historical data provided by the existing forecast provider. The local weather forecast model is capable of generating data indicative of future weather conditions for a plurality of locations upon receiving future forecast data provided by the existing forecast provider. The plurality of locations are associated with the plurality of data collection devices. The local weather forecast model may map the plurality of locations to their corresponding areas covered by an existing forecast provider or their corresponding closest grid points of an existing forecast provider.

The disclosed techniques further include temporally interpolating the local weather forecast data for the plurality of locations and generating higher-frequency local weather forecasts for the plurality of locations. The disclosed techniques also include spatially interpolating the local weather forecast data for the plurality of locations and generating local weather forecast data for other locations than the plurality of locations. In some examples, the generated local weather forecast data may be updated in response to receiving latest forecast data provided by the existing forecast provider. The forecast accuracy of the local weather model may be evaluated using a set of test data and monitored on an on-going basis.

Figure 1:
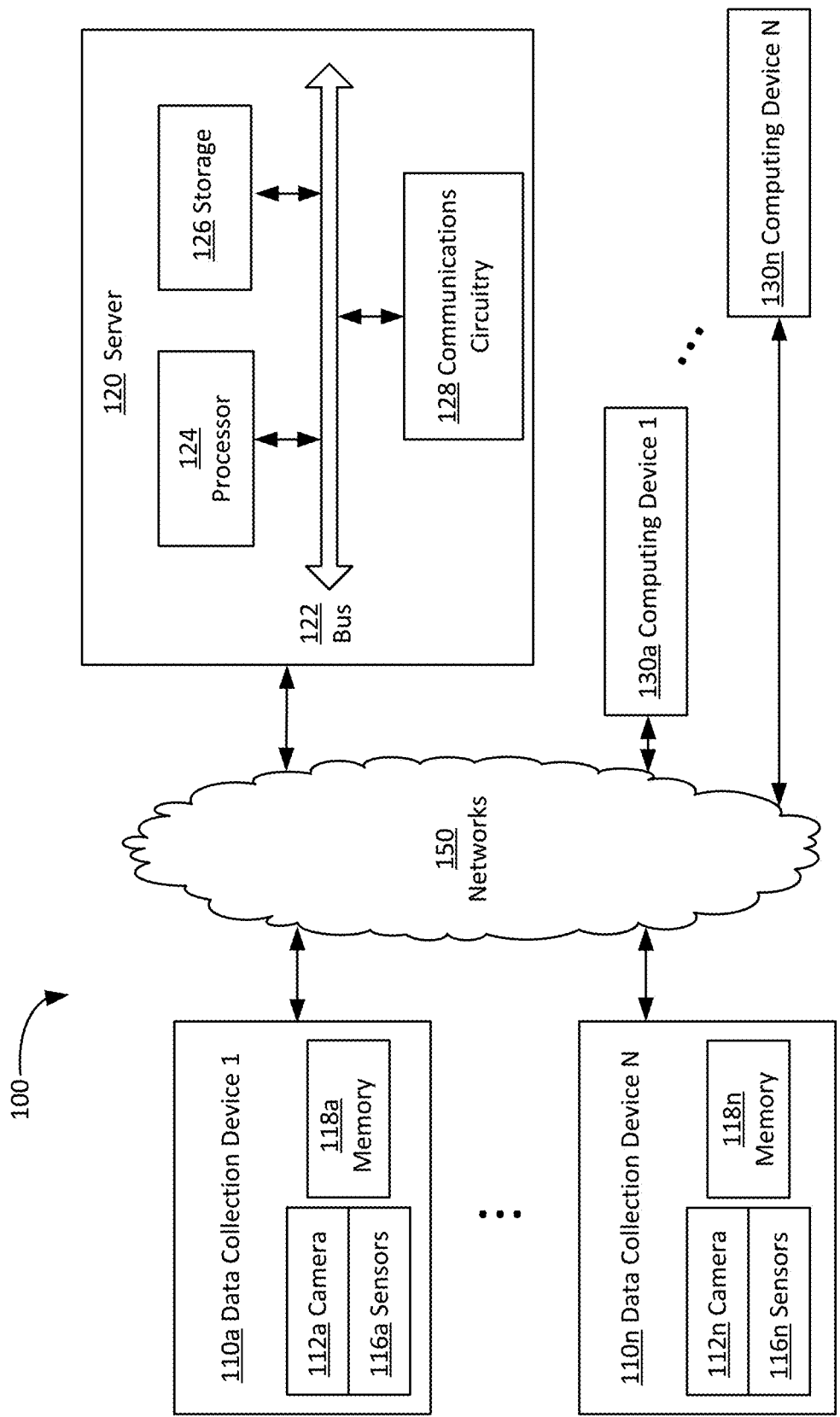
FIG. 1 is a schematic diagram illustrating an example system for collecting and processing weather data that may be used in accordance with the present disclosure.

FIG. 1 is a schematic diagram illustrating an example system 100 for collecting and processing weather data that may be used in accordance with the present disclosure. As shown, the system 100 comprises a plurality of weather data collection devices 110a . . . and 110n (collectively, 110), at least a server 120, and a plurality of computing devices 130a . . . , and 130n (collectively, 130). The data collection devices 110 and the computing devices 130 may communicate with the server 120 via one or more networks 150.

The data collection devices 110 are used to capture sky images and collect numerical data, such as temperature, humidity, barometric pressure, and precipitation. The data collection devices 110 may further collect data associated with wind speed, wind direction, rainfall, and UV exposure. The data collection devices 110 may be installed in any places on the earth, thereby forming a dense network of weather data collection devices 110. For instance, the data collection devices 110 may be installed in the ground or mounted on any suitable structures. Preferably, the data collection devices 110 are installed in locations with clear view of sky and as far as possible away from tall obstacles, such as trees, buildings, and fences.

The data collection devices 110 comprise cameras 112 for capturing sky images. The cameras 112 may be HD cameras with ultra-wide angle lens (e.g., 170 degree). The cameras may be any other suitable cameras. In some examples, the cameras 112 each may be fixed toward a particular view of sky, and they each may gather a series of time-sequenced sky images of a particular view every day (i.e., an image stream). At the end of each day, a series of sky images captured from a particular location may be combined into a spectacular time-lapse video for users to view and share. The data collection devices 110 may capture numerous series of time-sequenced sky images from various locations around the world.

Weather information may be accurately extracted from the time-sequenced sky images captured by the data collection devices 110. In some examples, these images may be used to determine cloud coverage, cloud type, and cloud moving direction so as to obtain comprehensive information relating to how a weather system or event, such as a thunderstorm system or precipitation, evolves over time at a given location or over a larger region, thereby enabling, for example, accurate weather forecasting.

The data collection devices 110 may also comprise sensors 116 for gathering temperature, humidity, barometric pressure, precipitation, wind speed, wind direction, UV exposure, and other data collection sensors. The sensors can be any suitable sensors for measuring corresponding parameters. The data collection devices 110 may further comprise memories 118 for storing the image and numerical data.

Typically, the data collection devices 110 may transmit data via the networks 150 to the server 120 for storing and processing. By example and without limitation, the data collection devices 110 each may comprise an outdoor unit and an indoor unit. The outdoor unit may collect and transmit weather data to the indoor unit by wireless communication. The indoor unit may further transmit the collected data to a cloud-based server, such as the server 120.

The server 120 may host one or more applications configured to manage services. For example, the server 120 may be configured to validate the computing devices 130 before they are authorized to access stored data. The server 120 may maintain information related to a user account including account details and others. The server 120 may operate one or more image libraries comprising images captured by the data collection devices 110, which may be accessed by the computing devices 130. Also, the server 120 may host one or more applications configured to interact with applications stored on the computing devices 130.

The server 120 may include a bus 122 which interconnects major components of the server 120, such as one or more processors 124, one or more storage devices 126, and communications circuitry 128. The processors 122 may be any suitable programmable control devices. The processors 122 may process data captured by the data collection devices 110 and extract various weather/climate information from image data. The storage devices 126 may be integral with the server 120 or may be separate and accessed through an interface. The storage devices 126 may store image streams captured by the data collection devices 110, software for implementing various functions on the server 120, and other data. The communications circuitry 128 may include one or more interfaces to allow the server 120 to communicate with the data collection devices 110, the computing devices 130, other servers, and/or databases via the one or more networks 150. The server 120 may be a cloud-based server.

Figure 2:
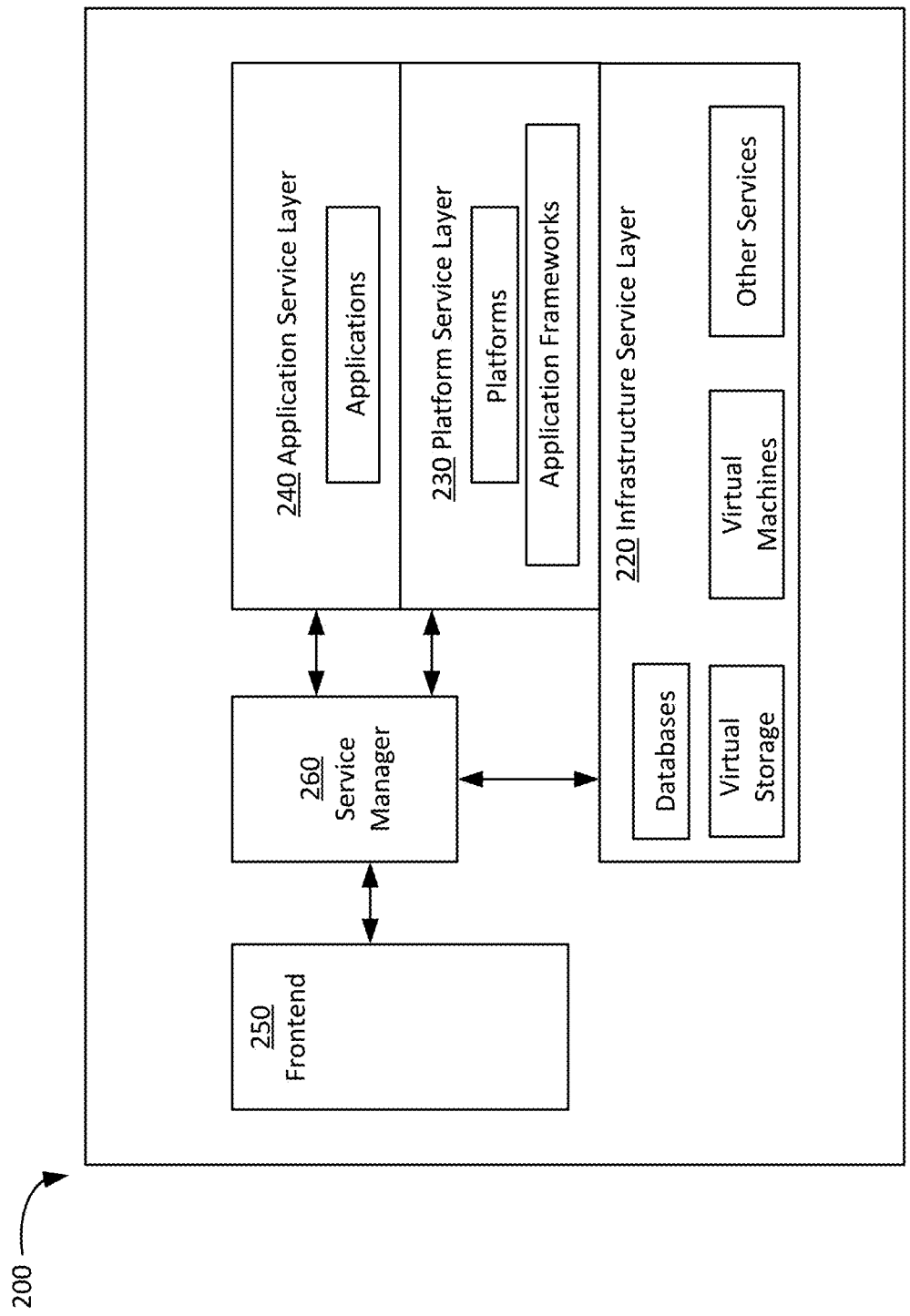
FIG. 2 is a schematic diagram illustrating an example cloud-based server that may be used in accordance with the present disclosure.

FIG. 2 is a schematic diagram illustrating an example cloud-based server 200 that may be used in accordance with the present disclosure. The cloud-based server 200 may provide infrastructure services, platform services, and software application services. The infrastructure services may include virtualized resources, such as virtual machines, virtual storage, and so on. The infrastructure services may also include virtualized services, such as database services and others. Each of these infrastructure services may be deployed in an infrastructure service layer 220.

The scale and various aspects, such as data, connectivity, and dependency relationships within and between service components, of an infrastructure service deployment are configurable by an administrator user. For instance, the administrator user may submit a configuration specification to the cloud-based server 200 via a frontend interface 250 and service manager 260. The configuration specification can be translated into infrastructure and kernel level APIs calls that create, re-create, move, or delete components such as virtual machines and services, and assign or change attributes of the components.

In addition to the infrastructure services, the cloud-based server 200 may also provide platform services, such as an environment for running virtual machines or a framework for developing and launching a particular type of software applications. The platform services may be implemented in a platform service layer 230 over the infrastructure service layer 220, and may employ one or more infrastructure services configured in a particular manner. Configuration of platform services can be accomplished by program code written according to the APIs of the platform services and, optionally, the APIs of the infrastructure services that are employed in enabling the platform services.

In some examples, the cloud-based server 200 may also provide software application services in an application service layer 240. A software application can be installed on one or more virtual machines or deployed in an application framework in the platform service layer 230. The software application can also communicate with one or more infrastructure service components, such as databases, in the infrastructure layer 220. The installation and configuration of the software application in the application service layer 240 can be accomplished through APIs of the software itself and the APIs of the underlying platform and infrastructure service components.

Depending on the type of services, a cloud-service user may be granted different levels of control in configuring the services. For example, if a software application service is employed, an administrator user is given control over how the software application is configured. If a platform service is employed, an administrative user is given control over how the platform and/or application frameworks are configured. Similarly, if infrastructure services are employed, an administrative user is given control over the particular infrastructure services employed.

Figure 3:
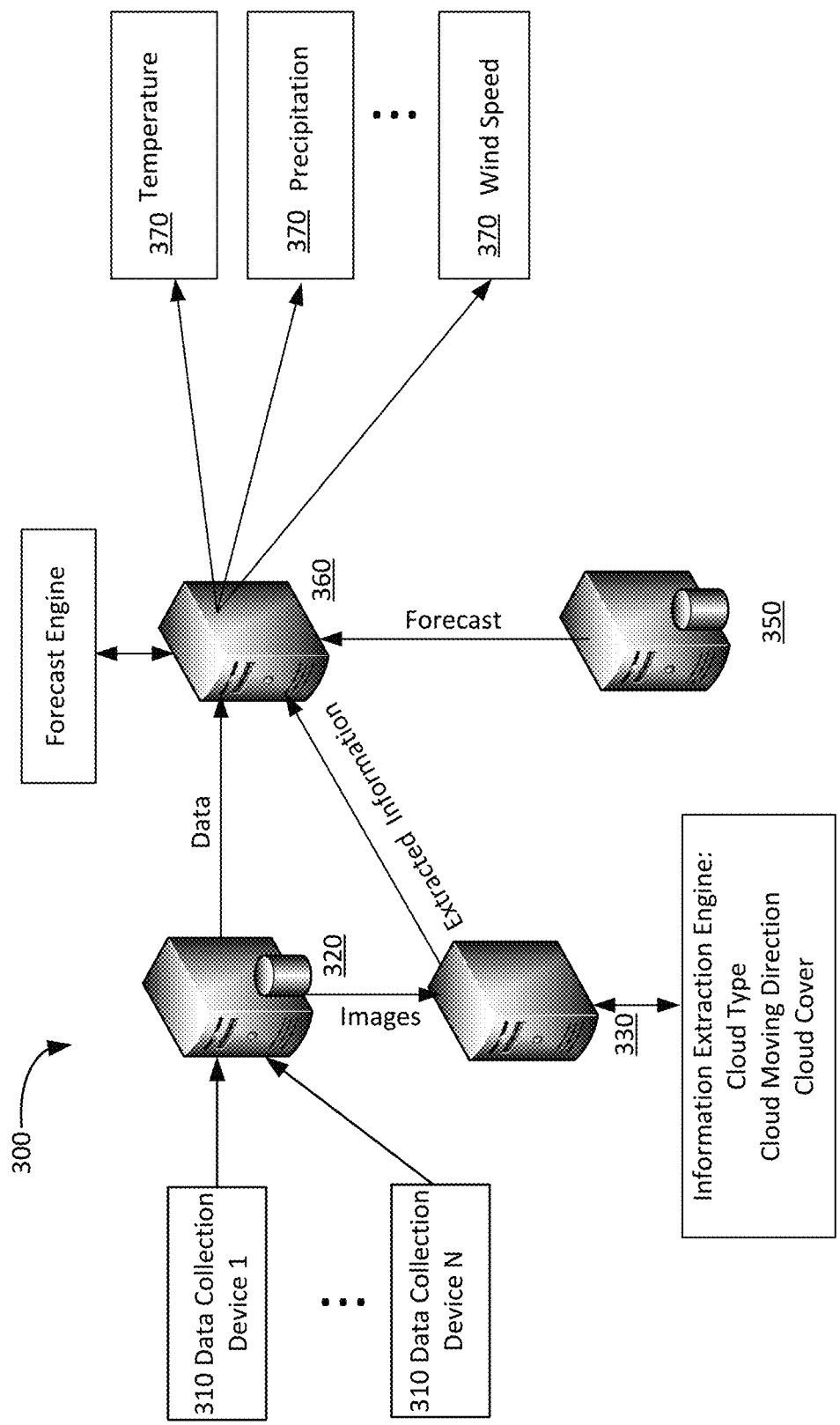
FIG. 3 is a schematic diagram illustrating a network environment of a system for local weather forecast in accordance with the present disclosure.

FIG. 3 illustrates an example system 300 for local weather forecast in accordance with the present disclosure. The system 300 comprises a plurality of data collection devices 310 (e.g., the data collection devices 110), one or more weather databases 320, an information extraction engine 330, one or more forecast databases 350, and a forecast engine 360. The plurality of data collection devices 310 are capable of collecting local numerical data e.g., temperature, humidity, barometric pressure) and capturing high-resolution sky images. The plurality of data collection devices 310 may be installed anywhere around the world.

The local data and sky images collected by the plurality of data collection devices 310 may be stored in the weather databases 320. The information extraction engine 330 is capable of extracting cloud information, such as cloud type, cloud cover and cloud moving direction, from the sky images collected by the data collection devices 310. The forecast databases 350 may store weather forecast data provided by any existing weather forecast providers, such as Aeris Weather and Global Forecast System (GFS). The forecast engine 360 is capable of providing accurate, highly-frequent, and local weather forecasts 370 such as temperature, precipitation, and wind forecasts.

The data collected by the data collection devices 310, the cloud information extracted by the information extraction engine 330, and historical weather forecast data provided by an existing forecast provider are fed into the forecast engine 360 for training local weather forecast models. A trained local weather forecast model is capable of generating accurate and local weather forecasts using weather forecasts for a future time provided by the existing forecast provider. The forecast data fed into the forecast engine 360 may be provided by any existing weather forecast providers, such as Aeris Weather and GFS. It should be appreciated that network topology illustrated in FIG. 3 has been greatly simplified and that many more networks and devices may be utilized to interconnect the various computing systems disclosed herein. It should also be appreciated that the system 300 described in FIG. 3 is merely illustrative and that other implementations might be utilized.

Additionally, it should be appreciated that the functionality disclosed herein might be implemented in software, hardware or a combination of software and hardware. Other implementations should be apparent to those skilled in the art. It should also be appreciated that a server, gateway, or other computing device may comprise any combination of hardware or software that can interact and perform the described types of functionality, including without limitation desktop or other computers, database servers, network storage devices and other network devices, PDAs, tablets, cellphones, wireless phones, pagers, electronic organizers, Internet appliances, television-based systems (e.g., using set top boxes and/or personal/digital video recorders), and various other consumer products that include appropriate communication capabilities. In addition, the functionality provided by the illustrated modules may in some embodiments be combined in fewer modules or distributed in additional modules. Similarly, in some embodiments the functionality of some of the illustrated modules may not be provided and/or other additional functionality may be available.

The plurality of data collection devices 310 may be the data collection devices 110 as described above. Preferably, numerous data collection devices 310 are locally-installed and they form a dense network of collecting sky images and numerical data, such as temperature and humidity. The data collection devices 310 may continuously collect numerical data and take real-time sky images from the ground. Compared to Doppler radar cloud map and remote sensing signals from satellites, the data and images captured by the data collection devices 310 feature higher frequency and higher localization. The numerical data and sky images collected by the data collection devices 310 may be transmitted to and stored in the weather databases 320.

The data collection devices 310 each may be associated with a user identifier (i.e., user ID) and a device identifier (i.e., device ID). The data transmitted by the data collection devices 310 may comprise the corresponding user ID, device ID, location and time information in addition to the captured sky images and other data. In some examples, the data collection devices 310 each may be associated with a corresponding computing device. The user ID, device ID, location and time information may be transmitted by the corresponding computing device to the weather databases 320. One or more databases, such as the weather databases 320, may be created to contain data transmitted by the data collection devices 310 and/or the corresponding computing devices.

Figure 4:
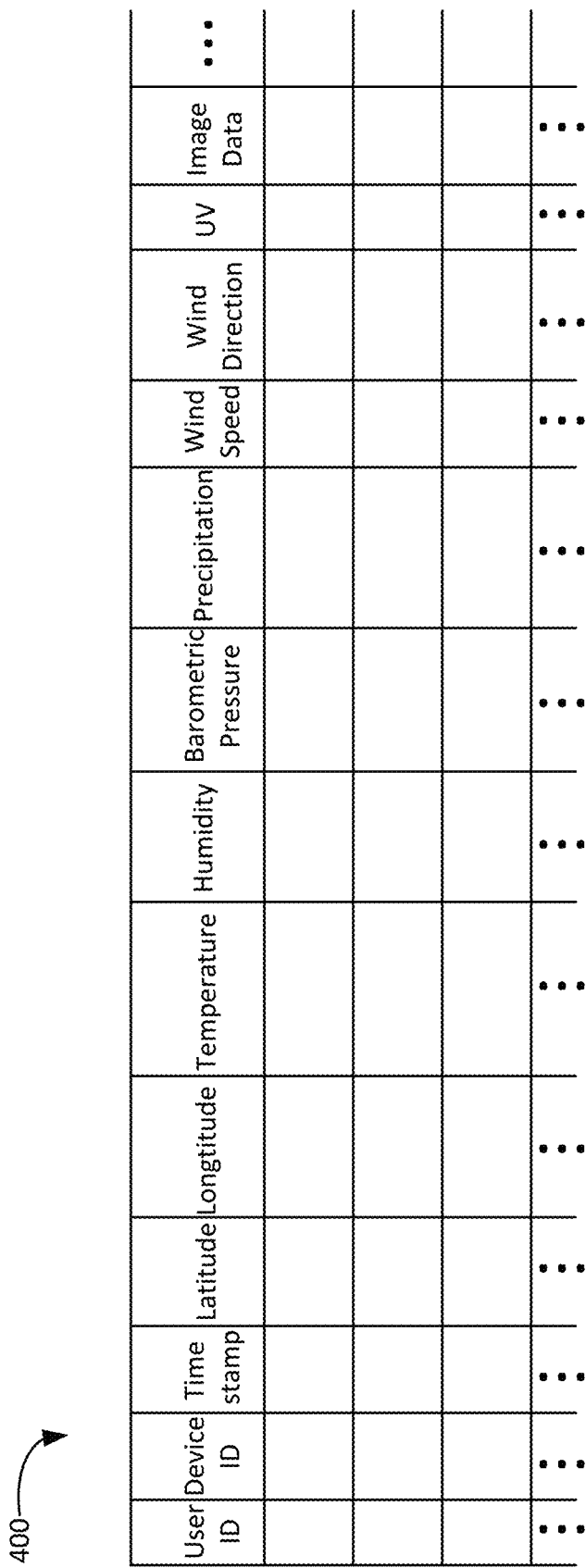
FIG. 4 is a simplified diagram illustrating example data metrics of a weather database that may be used in accordance with the present disclosure.

FIG. 4 is a simplified diagram illustrating example data metrics 400 of the weather databases 320 that may be used in accordance with the present disclosure. As shown, data metrics 400 include user ID, device ID, timestamp, latitude, longitude, temperature, humidity, barometric pressure, precipitation, wind speed, wind direction, UV exposure, image data, and so on. The forecast databases 350 may include similar metrics, such as temperature, humidity, barometric pressure, precipitation, wind speed, wind direction, UV exposure, location and time information. Multiple databases may be organized in any suitable way that can support data processing and information extraction. For instance, a separate database may be created to store sky images captured by the data collection devices 310 along with corresponding ID, timestamp, latitude and longitude. The weather databases 320 and the forecast databases 350 may be updated periodically in order to reflect new data. The weather databases 320 and the forecast databases 350 may be broken into subsets of data and processed in parallel by separate systems.

The weather databases 320 may provide the forecast engine 360 numerical data collected by the data collection devices 310, such as temperature and precipitation data, for weather forecast. The weather databases 320 may also provide sky images captured by the data collection devices 310 to the information extraction engine 330, The cloud information exaction engine 330 in accordance with the present disclosure is capable of determining cloud type, cloud moving direction, cloud cover, and other information related to the clouds. The cloud information exaction engine 330 may provide extracted cloud information to the forecast engine 360 for local weather forecast.

The information extraction engine 330 may access or receive various data, such as sky image data stored in the weather databases 320 and data received from users. The information extraction engine 330 may also generate or cause to generate data. In some embodiments, the information extraction engine 330 may monitor new images collected by the data collection devices 310. It should be understood that the information extraction engine 330 may gather data from any of computing resources including servers, databases, storage, and the like. The information extraction engine 330 may be made accessible via an application programming interface (API) or a user interface that may be accessed via a Web browser or other input mechanisms. The information extraction engine 330 may provide a detailed analysis and summary of results to requesting users.

Cloud information, such as cloud type, cloud moving direction, and cloud cover, is a valuable data source for weather forecast. For instance, cloud type is a good indicator of changes in weather: low puffy cloud predicts a sunny day while dark clouds are frequently followed by a heavy rain. The information extraction engine 330 may convert visual cloud signals, such as cloud type, into numerical values that the forecast engine 360 can use for accurate local weather forecast.

Figure 5:
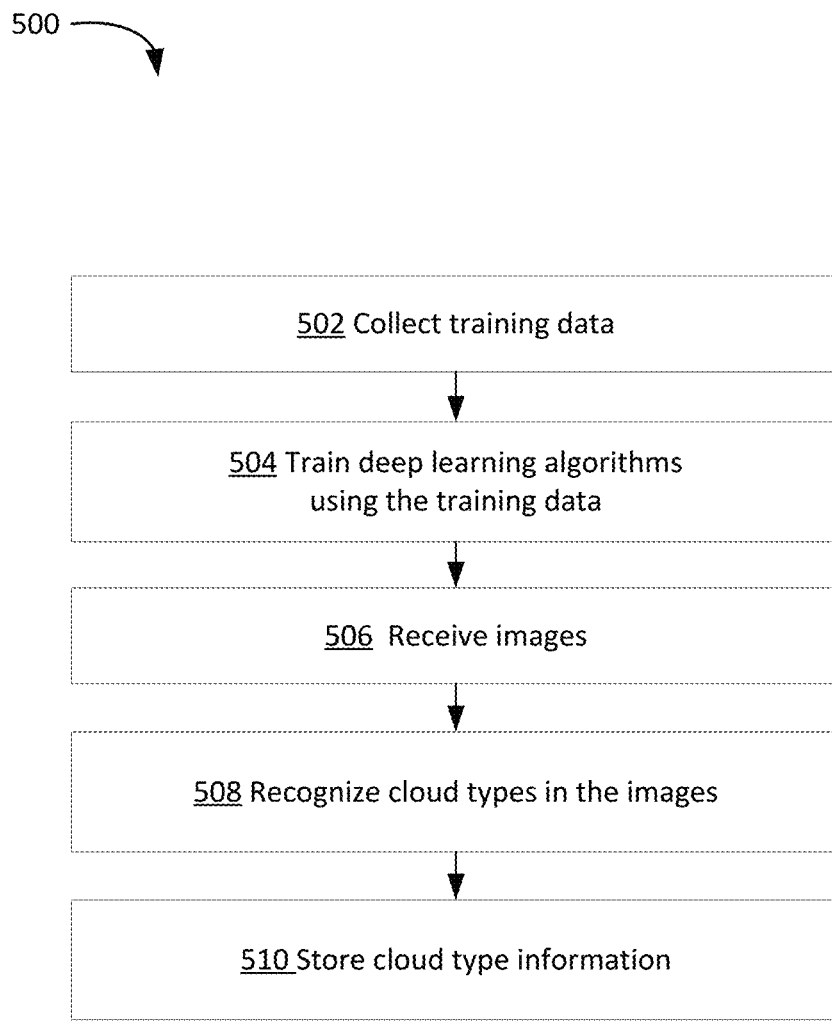
FIG. 5 is a flowchart illustrating an example process for cloud type determination that may be used in accordance with the present disclosure.

FIG. 5 is a flowchart illustrating an example process 500 for cloud type determination that may be used in accordance with the present disclosure. The information extraction engine 330 or other computing devices may be used singly or in combination to implement the cloud type determination process 500. Although depicted as a sequence of operations, those of ordinary skill in the art will appreciate that various embodiments may add, remove, reorder, or modify the depicted operations.

Operation 502 illustrates acquiring training data. The training data are used to train deep learning algorithms for recognizing and predicting cloud type. By example and without limitation, the training data may be obtained by collecting high-quality labeling information relating to cloud types. Preferably, pre-labelling cloud types in sky images is conducted by meteorologists or weather staff. According to World Meteorological Organization, the cloud types could be classified as the following categories: (1) Cumulus—low puffy clouds with clearly defined edges, white or light-grey; (2) Cirrus/Cirrostratus High—thin clouds, wisplike or sky covering, whitish; (3) Cirrocumulus/Altocumulusz—high patched clouds of small cloudlets, mosaic-like, white; (4) Clear sky—no clouds and cloudiness below 10%; (5) Stratocumulus—low to mid-level, lumpy layer of clouds, broken to almost overcast, white or grey; (6) Stratus/Altostratus—Low or mid-level layer of clouds, uniform, usually overcast, grey; and (7) Cumulonimbus/Nimbostratus—Dark, thick clouds, mostly overcast, grey.

Operation 504 illustrates training deep learning algorithms using the collected training data. Any suitable deep learning algorithms may be employed. By example and without limitation, AWS GPU (Amazon Web Services Graphics Processing Unit) infrastructure may be used to train Convolutional Neutral Networks (ConvNets) for recognizing cloud type. In other embodiments, TensorFlow infrastructure is used to train deep learning algorithms. The model performance may be assessed by cross validation or other methods to evaluate supervised learning algorithms.

If the model performance is not satisfactory, the cloud type determination process 500 may return to operation 502 so as to collect more training data and further train the deep learning algorithms. On the other hand, if the model performance is satisfactory, the cloud type determination process 500 may proceed to operation 506. A well-trained deep learning model can recognize cloud type with an accuracy of 85% or more. It should be appreciated that any suitable techniques for determining whether the model performance is satisfactory may be employed.

Operation 506 illustrates receiving sky images. In some embodiments, the images may be provided by the data collection devices 310 or other image capturing devices. In other embodiments, the image data may be provided by the weather databases 320 or other separate cloud storage servers in which the sky images are stored.

Figure 6:
FIG. 6 illustrates an example image and corresponding determined cloud types.

Operation 508 illustrates recognizing cloud types in the sky images. The recognition results may be presented as probabilities of various cloud types. FIG. 6 illustrates a sky image and the corresponding recognition result. It should be appreciated that, depending on the sky images' capture times and locations, the cloud type determination process 500 may be used to determine cloud type information at a given location at different times, cloud type information at different locations at the same time, or aggregate cloud type information over a certain area within a certain time of period based on the timestamps and location information associated with the sky images.

Figure 7:
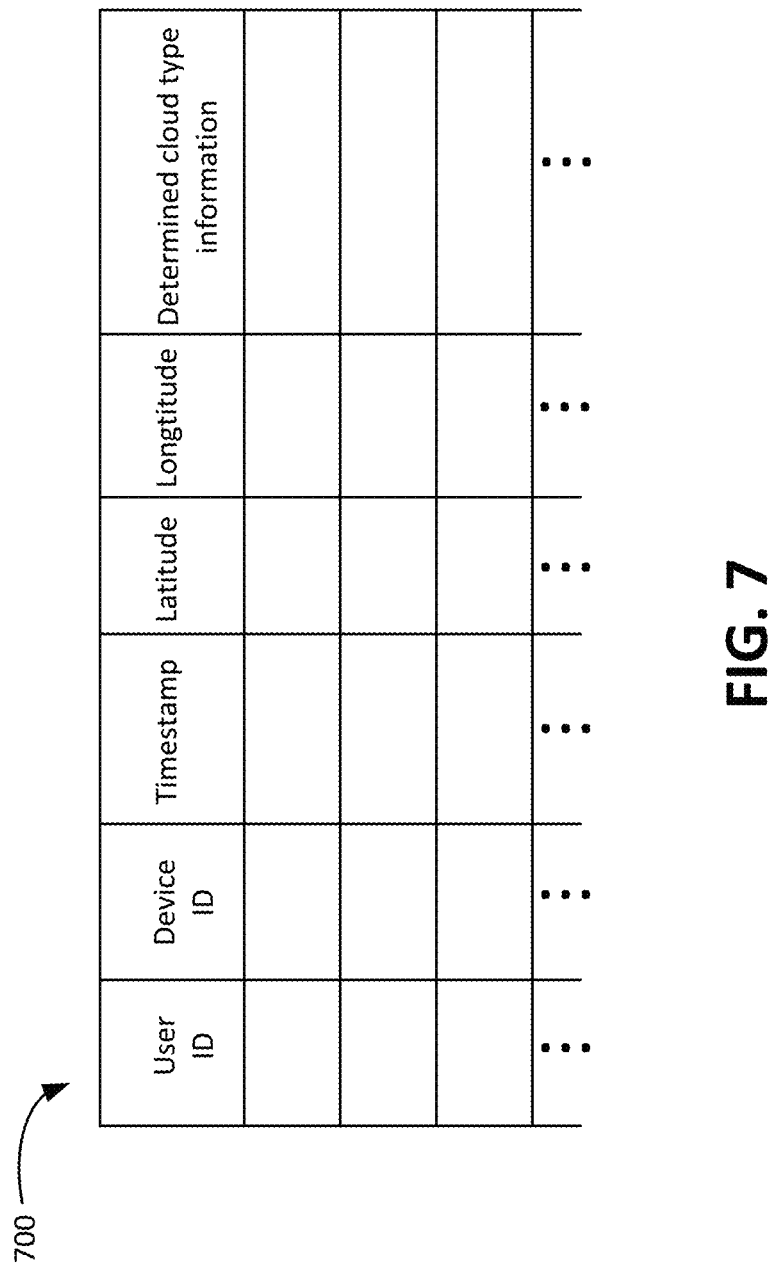
FIG. 7 is a simplified diagram illustrating example data metrics of a cloud type database that may be used in accordance with the present disclosure.

Operation 510 illustrates storing the determined cloud type information for use. The cloud type information may be stored locally, in the weather database 320, or other separate storage server or computing device. FIG. 7 is a simplified diagram illustrating example data metrics 700 of a cloud type database that may be used in accordance with the present disclosure. In some embodiments, the determined cloud type information may be directly fed into the forecast engine 360.

Figure 8:
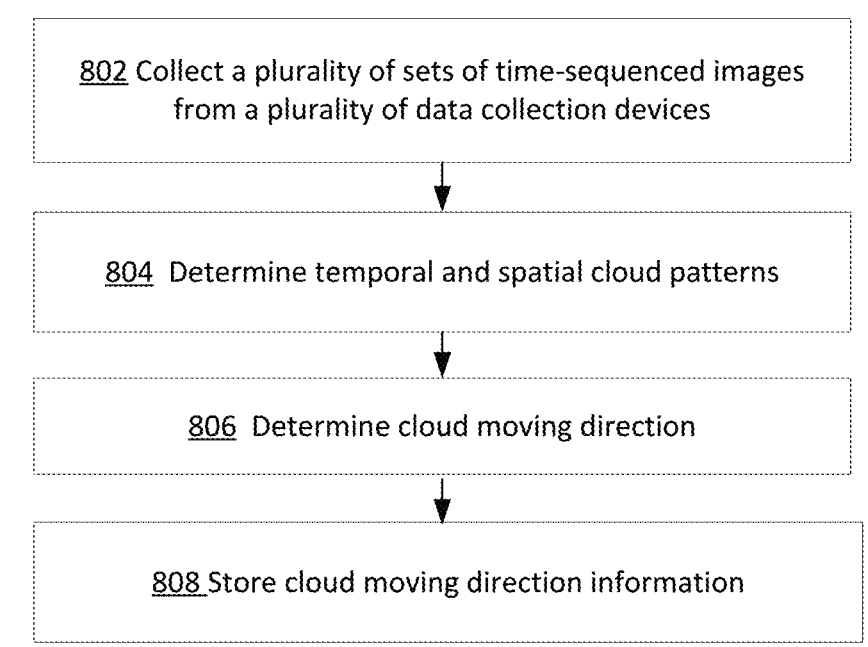
FIG. 8 is flowchart illustrating an example process for determining cloud moving direction that may be used in accordance with the present disclosure.

FIG. 8 is a flowchart illustrating an example process 800 for determining cloud moving direction. The information extraction engine 330 or other computing devices may be used singly or in combination to implement the cloud type determination process 800. Although depicted as a sequence of operations, those of ordinary skill in the art will appreciate that various embodiments may add, remove, reorder, or modify the depicted operations.

Operation 802 illustrates collecting time-sequenced sky images from a plurality of data collection devices 310 installed within a certain region. In some embodiments, the images may be provided by the data collection devices 310 or other image capturing devices. By way of example and without limitation, the cameras of the data collection devices 310 may be programmed to take pictures every certain time interval, such as every three minutes. In some examples, the cameras of the data collection devices 310 each may gather a series of time-sequenced sky images from a particular location. The data collection devices 310 may be locally installed at any places. For instance, a plurality of data collection devices 310 are installed in a community. Thus, the plurality of data collection devices 310 are capable of capturing numerous series of time-sequenced sky images from various locations within the community.

In other embodiments, the time-sequenced sky images may be provided by the weather databases 320 or other separate cloud storage servers in which the time-sequenced sky images as well as their corresponding timestamps and location information are stored. The time-sequenced and localized sky images captured by the data collection devices 310 may be added to Doppler radar weather map to depict the formation and moving directions of clouds at a higher resolution, thereby enhancing the accuracy of conventional weather forecasts.

Operation 804 illustrates determining temporal and spatial cloud patterns using the collected time-sequenced sky images. The cloud moving direction determination process 800 determines a cloud pattern in a certain region at a certain time using sky images captured from various locations in the certain region at the same time. The cloud moving direction determination process 800 further determines cloud patterns in the certain region at different times using sky images captured at the different times based on the timestamps and location information associated with the sky images. It should be appreciated that any suitable techniques may be employed to aggregate temporal and spatial cloud patterns based on the timestamps and location information associated with the sky images.

Operation 806 illustrates determining cloud moving direction in a certain region. The cloud moving direction determination process 800 determines cloud moving direction based on changes of temporal and spatial cloud patterns in the certain region. Any suitable techniques may be used to compute the cloud moving direction based on the changes of temporal and spatial cloud patterns. Operation 810 illustrates storing the determined cloud moving direction information. The cloud moving direction information may be stored locally, in the weather database 320, or other separate storage server or computing device.

Figure 9:
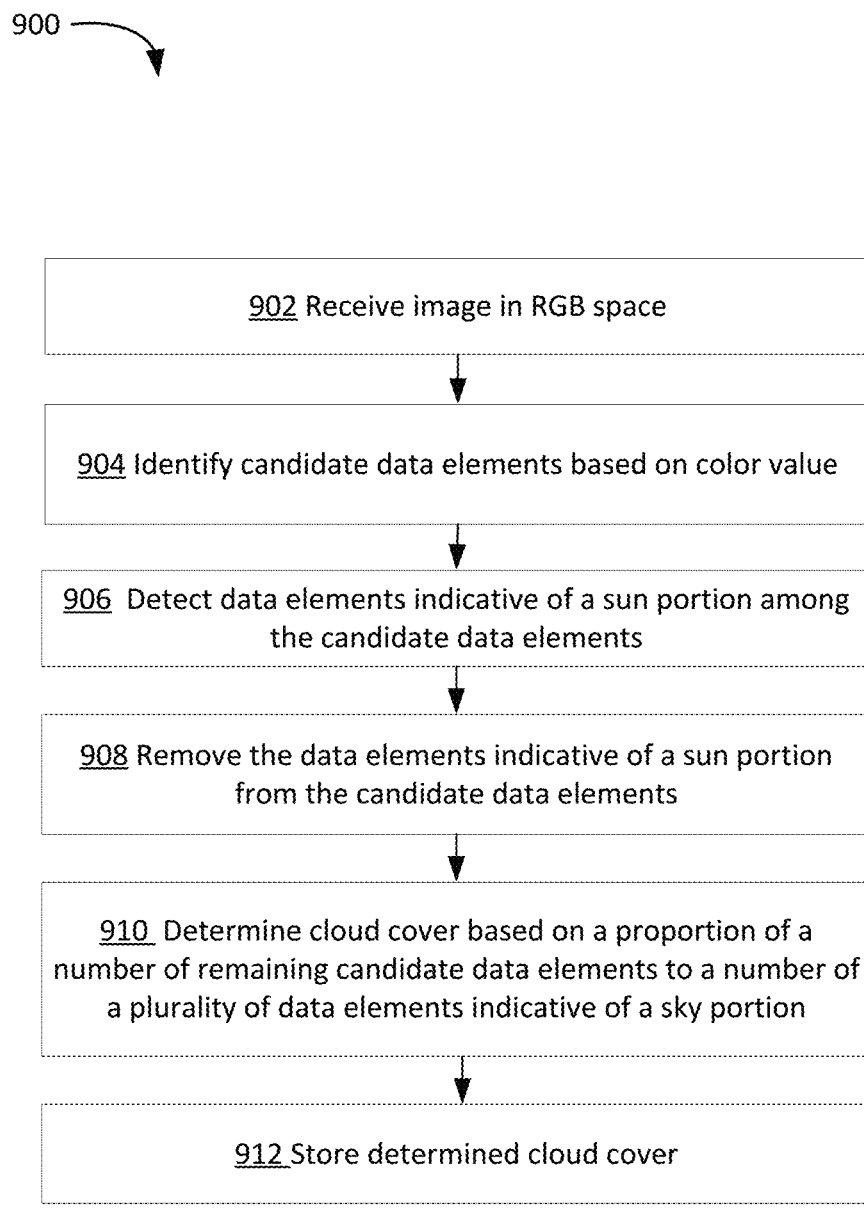
FIG. 9 is a flowchart illustrating an example process for cloud cover determination that may be used in accordance with the present disclosure.

FIG. 9 is a flowchart illustrating an example process 900 for determining cloud cover. The information extraction engine 330 or other computing devices may be used singly or in combination to implement the cloud cover determination process 900. Although depicted as a sequence of operations, those of ordinary skill in the art will appreciate that various embodiments may add, remove, reorder, or modify the depicted operations.

Operation 902 illustrates receiving sky image data in a predetermined image format, such as RGB (Red, Green, Blue) format. The sky image comprises a plurality of data elements, such as pixels. RGB color values of the data elements is used to classify them into candidate cloud data elements or clear sky data elements. For example, if color values of a data element satisfy criteria of |R−B|<30 and |B−G|<30, the data element will be classified as a candidate cloud data element. If, on the other hand, color values of a data element fail to satisfy the criteria of |R−B|<30 and |B−G|<30, the data element will be classified as a clear sky data element.

However, classifying data elements merely based on color value criteria may lead to mistakenly classifying data elements in a sun portion as candidate cloud data elements. In order to eliminate potential errors, at operation 906, a sun detection algorithm may be used to detect whether there exist data elements indicative of a sun portion among the candidate cloud data elements. If so, at operation 908, the data elements indicative of a sun portion are eliminated from the candidate cloud data elements. Additional details on sun detection algorithm are described in U.S. Pat. No. 9,792,522 B2 that is incorporated herein by reference in its entirety.

Operation 910 illustrates determining cloud cover based on a proportion of a number of the remaining candidate cloud data elements (i.e., real cloud data elements) to a number of the plurality of data elements in the sky image. At operation 912, the determined cloud amount may be stored locally, in the weather database 320, or other separate storage server or computing device.

The forecast engine 360 in accordance with the present disclosure is capable of providing accurate local weather forecasts based on correlations between data collected by the data collection devices 310 and historical forecast data provided by an existing forecast provider. While embodiments of forecasting local temperature using the forecast engine 360, for convenience and simplicity, will be described in greater detail herein, it is to be understood that the present disclosure is not limited to temperature forecasts and could be used for humidity, barometric pressure, UV index, precipitation, wind speed, and wind direction forecasts.

By example and without limitation, the forecast engine 360 may train machine learning models for local temperature forecasts. A temperature forecast model employed by the forecast engine 360 may be expressed as:

$$F(T_{t,forecast}, Cloud\_Type_{t-\Delta t}, Pressure_{t-\Delta t}, \ldots) \sim T_{t,device}$$

"F" represents a forecast model, and it can be viewed as a regressor that learns the correlation between multi-dimensional input features (i.e., the features in the parentheses) and an output feature. "T" represents temperature or any other forecast metrics. "Δt" represents a time difference, and "t" represents a specific time. $T_{t,forecast}$ represents weather forecast data provided by an existing forecast provider, such as GFS. "Cloud_Type" represents cloud type information extracted from the images captured by the data collection devices 310. "Pressure" represents barometric pressure data collected by the data collection devices 310. $T_{t,device}$ represents output local weather forecast for a specific location where a corresponding data collection device is installed.

It should be appreciated that the formula presented above is merely illustrative. It is to be understood that the present disclosure is not limited to local temperature forecasts and could be used for local humidity forecasts, local barometric pressure forecasts, local UV index forecasts, local precipitation forecasts, local wind speed and local wind direction forecasts. It should also be appreciated that the multi-dimensional input features may include cloud moving direction, cloud cover, and other cloud information extracted from the images captured by the data collection devices 310. It should also be appreciated that the multi-dimensional input features may further include any numerical data measured by the data collection devices 310.

Figure 10:
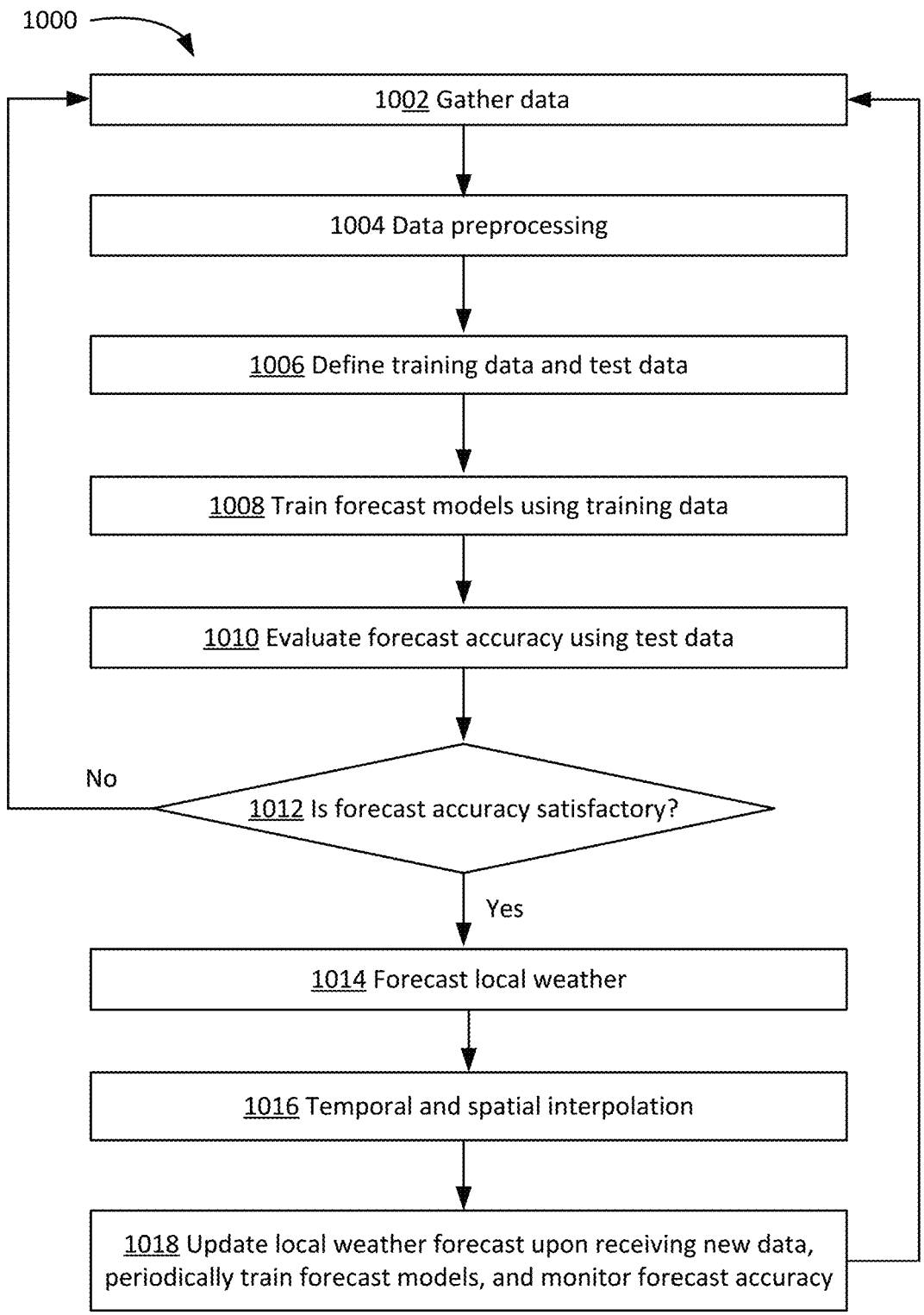
FIG. 10 is a flowchart illustrating an example process for local weather forecast in accordance with the present disclosure.

FIG. 10 is a flowchart illustrating an example process 1000 for local weather forecast. A server or other computing device may be used singly or in combination to implement the local weather forecast process 1000. Although depicted as a sequence of operations, those of ordinal y skill in the art will appreciate that various embodiments may add, remove, reorder, or modify the depicted operations.

At operation 1002, relevant data are gathered. The forecast engine 360 may gather data from any components, such as the weather databases 320, the information extraction engine 330, and the forecast databases 350. The forecast engine 360 may also collect information stored in other locations or resources. The forecast engine 360 may manage various data. The forecast engine 360 may also generate or cause to generate data. The forecast engine 360 may analyze the data, combine or aggregate the data or extract portions of the data as appropriate, and invoke the weather forecast model to generate local weather forecast data.

Operation 1004 illustrates preprocessing the data. Some of the data collection devices 310 may gather inaccurate data due to various reasons, such as improper installation and poor WiFi connections. Various techniques may be deployed to evaluate and enhance data quality. In some embodiments, outlier data collection devices with relatively high error rates are detected and data collected by the outlier data collection devices are removed. The outlier data collection devices may be detected by scanning collected data, comparing them to corresponding forecast data, and calculating error rates. If the error rate is consistently over a predetermined threshold, such as 35%, the corresponding data collection device is classified as an outlier data collection device and the data collected by the outlier data collection device are removed.

In other embodiments, some of the data collection devices 310 may bear intrinsic bias under certain circumstances, such as non-standard measurement conditions. Such circumstances may lead to inaccurate collected data. Some techniques may be used to improve quality of collected data. For instance, collected data may be calibrated against ground truth data gathered by data collection devices with high accuracy after systematically analyzing the differences between the collected data and the ground truth data.

Operation 1006 illustrates defining training data and test data. Preferably, two separate and independent sets of data are defined as training data and test data, respectively. The set of training data will be used to train local weather forecast models. The set of test data will be used to test the local weather forecast models and evaluate their forecast accuracy. In some embodiments, the set of training data may be the time-sequenced data collected by the data collection devices 310, and the set of test data may be the ground truth data gathered by other data collection devices with high accuracy.

Operation 1008 illustrates training the local weather forecast models using the set of training data. Various regression models may be employed, such as linear regression, polynomial regression, local weighted scatterplot smoothing, and support vector regression. Preferably, the set of training data comprise a maximum number of data points for each of the data collection devices 310 to ensure a satisfactory training result.

Operation 1010 illustrates evaluating forecast accuracy of a local weather forecast model using the set of test data. Various techniques may be employed to determine the forecast accuracy. In some embodiments, the forecast accuracy may be measured by comparing local weather forecast data to the set of test data the ground truth data) using RMSE (root mean square error) and absolute error percentage. In other embodiments, absolute error percentage Cumulative Density Function (CDF) is used to evaluate forecast accuracy. Absolute error percentage CDF can show a model performance at different error percentage threshold. An ideal model with perfect predictions is at error 0% and data point 100%.

Operation 1012 determines whether the forecast accuracy is satisfactory. If the forecast accuracy is satisfactory, the forecast process 1000 may proceed to operation 1014. On the other hand, if the forecast accuracy is not satisfactory, the forecast process 1000 may return to operation 1002 and the operations 1002 through 1010 will be iterated. It should be appreciated that any suitable techniques for determining whether forecast accuracy is acceptable may be employed.

Figure 11:
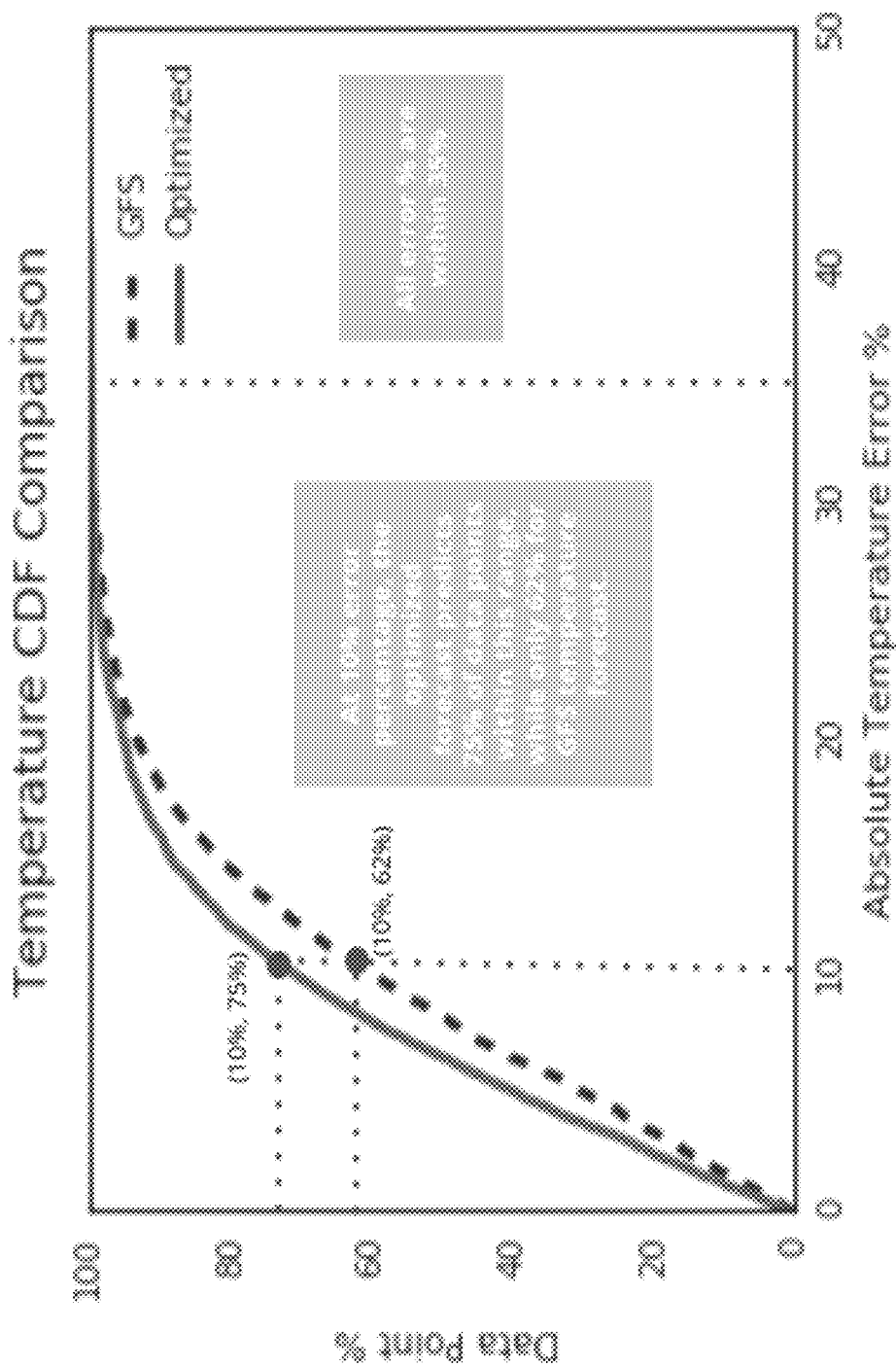
FIG. 11 is a chart illustrating comparisons between existing weather forecasts and local weather forecasts generated by a local weather forecast model in accordance with the present disclosure.

A trained local weather forecast model may significantly improve forecast accuracy for any given locations. FIG. 11 depicts comparisons between local weather forecast data generated by a trained local weather forecast model and forecast data provided by an existing forecast provider (such as GFS). The solid line represents the local forecast data generated by the forecast model; and the broken line represents the forecast data provided by an existing forecast provider, such as GFS. The solid line consistently stays above the broken line, which illustrates that the forecast model has significantly improved the forecast accuracy. Specifically, the local weather forecast data generated by the forecast model decrease error percentage from 14% to 10% at the same portion of data points 75%, and increase the portion of temperature data points from 62% to 75% for the error percentages <=10%. In one embodiment, the local weather forecast model is applied on an independent test dataset and its performance is evaluated via the RMSE; the local weather forecast is improved by around 32% compared to the GFS outputs at closest grid point.

Operation 1014 illustrates using a trained forecast model to forecast local weather for a plurality of specific locations associated with a plurality of data collection devices 310 based at least on weather forecast data provided by an existing forecast provider. In some examples, GFS 0p50 (horizontal resolution of 0.50 degree) is selected to provide weather forecast data. The entire globe is covered by the GFS at a base horizontal resolution of 18 miles (28 kilometers) between grid points, which is used by the operational forecasters who predict weather out to 16 days in the future. Horizontal resolution drops to 44 miles (70 kilometers) between grid point for forecasts between one week and two weeks. The GFS dataset is run four times daily at 0000, 0600, 1200 and 1800 GMT out to 192 hours with a 0.5 degree horizontal resolution and a 3 hour temporal resolution.

The local weather forecast model in accordance with the present disclosure is capable of mapping a specific location associated with a specific data collection device to a closest point on a grid of an existing forecast provider or a corresponding area covered by an existing forecast provider. In some examples, forecast data for a corresponding area defined by GFS grid points within which a specific location falls is taken as a baseline of local weather forecast for the specific location. Applying the local weather forecast model on weather forecast data provided by an existing forecast provider may produce short-term (e.g., hourly) local weather forecast data for a plurality of locations where a corresponding plurality of data collection devices 310 are installed.

Operation 1016 illustrates performing temporal and spatial interpolation. In some embodiments, higher-frequency local weather forecast data (e.g., forecasts on an hourly scale or on a half-hourly scale) may be generated by temporally interpolating three-hourly output local weather forecast data. In other embodiments, forecast data at locations where no data collection devices is installed may be generated by spatially interpolating output local weather forecast data using location information associated to the plurality of data collection devices 310. The spatial interpolation may be performed as a function of the distances from the locations to their respective closest data collection device. The local weather forecast data generated by the local weather forecast model may be returned to a user who requests local weather forecast information based on the latitude and longitude of a point of interest.

Operation 1018 illustrates updating local weather forecasts upon receiving new weather forecast data provided by the existing forecast provider, periodically training local weather forecast model, and monitoring forecast accuracy of the local weather forecast model. The local weather forecast data may be updated over time as the latest data provided by the existing forecast provider become available. By example and without limitation, the local weather forecasts are updated every six hours upon receiving new GFS data when GFS releases its latest forecasts. The forecast model may periodically be trained. For example, the local weather forecast model may be trained every month and used to generate local weather forecast data for the following month. In some embodiments, the forecast accuracy of the forecast model may be monitored on an on-going basis and used as a trigger to iterate operations 1002 through 1016.

The above described aspects of the disclosure have been described with regard to certain examples and embodiments, which are intended to illustrate but not to limit the disclosure. It should be appreciated that the subject matter presented herein may be implemented as a computer process, a computer-controlled apparatus or a computing system or an article of manufacture, such as a computer-readable storage medium. While the subject matter described herein is presented in the general context of program modules that execute on one or more computing devices, those skilled in the art will recognize that other implementations may be performed in combination with other types of program modules. Generally, program modules include routines, programs, components, data structures, and other types of structures that perform particular tasks or implement particular abstract data types.

Those skilled in the art will also appreciate that the subject matter described herein may be practiced on or in conjunction with other computer system configurations beyond those described herein, including multiprocessor systems, microprocessor-based or programmable consumer electronics, minicomputers, mainframe computers, handheld computers, personal digital assistants, e-readers, cellular telephone devices, special-purposed hardware devices, network appliances, and the like. The embodiments described herein may also be practiced in distributed computing environments, where tasks are performed by remote processing devices that are linked through a communications network. In a distributed computing environment, program modules may be located in both local and remote memory storage devices.

A network set up by an entity, such as a company or a public sector organization, to provide one or more services (such as various types of cloud-based computing or storage) accessible via the Internet and/or other networks to a distributed set of clients may be termed a provider network. Such a provider network may include numerous data centers hosting various resource pools, such as collections of physical and/or virtualized computer servers, storage devices, networking equipment, and the like, needed to implement and distribute the infrastructure and services offered by the provider network. The resources may in some embodiments be offered to clients in units called instances, such as virtual or physical computing instances or storage instances. A virtual computing instance may, for example, comprise one or more servers with a specified computational capacity (which may be specified by indicating the type and number of CPUs, the main memory size, and so on) and a specified software stack (e.g., a particular version of an operating system, which may in turn run on top of a hypervisor).

A number of different types of computing devices may be used singly or in combination to implement the resources of the provider network in different embodiments, including general-purpose or special-purpose computer servers, storage devices, network devices, and the like. In some embodiments a user may be provided direct access to a resource instance, e.g., by giving a user an administrator login and password. In other embodiments, the provider network operator may allow users to specify execution requirements for specified applications and schedule execution of the applications on behalf of the user on execution platforms (such as application server instances, Java™ virtual machines (JVMs), general-purpose or special-purpose operating systems, platforms that support various interpreted or compiled programming languages—such as Ruby, Perl, Python, C, C++, and the like or high-performance computing platforms) suitable for the applications. This may be done without, for example, requiring the client to access an instance or an execution platform directly. A given execution platform may utilize one or more resource instances in some implementations in other implementations, multiple execution platforms may be mapped to a single resource instance.

Figure 12:
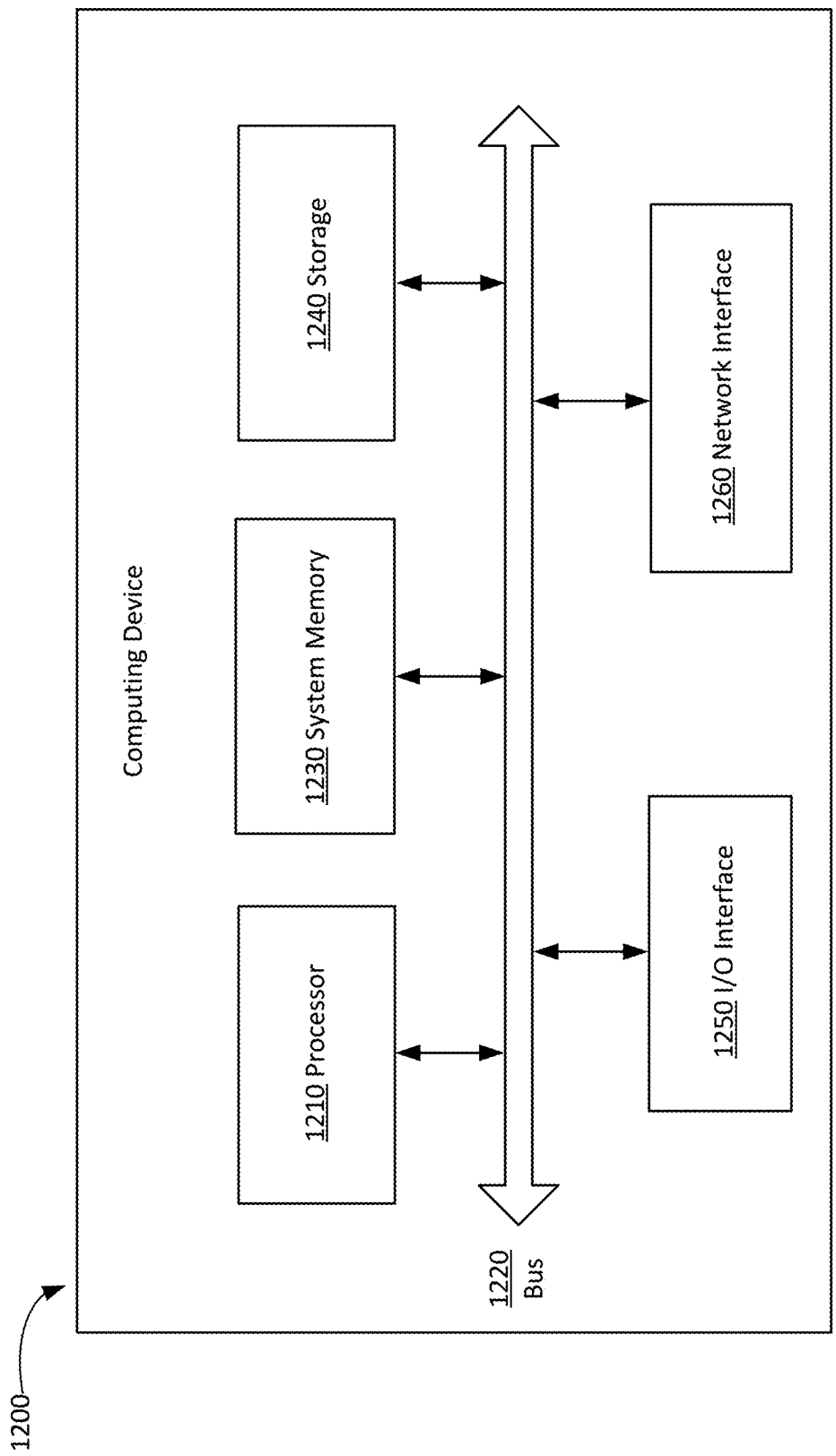
FIG. 12 is a schematic diagram illustrating an example computing device that may be used in accordance with the present disclosure.

In at least some embodiments, a server or computing device that implements a portion or all of one or more of the technologies described herein, including the techniques to implement the functionality of a forecast engine 360 and an information extraction engine 330, may include a general-purpose computer system that includes or is configured to access one or more computer-accessible media. FIG. 12 illustrates such a general-purpose computing device 1200. In the illustrated embodiment, computing device 1200 includes one or more processors 1210 (which may be referred herein singularly as "a processor 1210" or in the plural as "the processors 1210") are coupled through a bus 1220 to a system memory 1230. Computing device 1200 further includes a permanent storage 1240, an input/output (I/O) interface 1250, and a network interface 1260.

In various embodiments, computing device 1200 may be a uniprocessor system including one processor 1210 or a multiprocessor system including several processors 1210 (e.g., two, four, eight, or another suitable number). Processors 1210 may be any suitable processors capable of executing instructions. For example, in various embodiments, processors 1210 may be general-purpose or embedded processors implementing any of a variety of instruction set architectures (ISAs), such as the x86, PowerPC, SPARC, or MIPS ISAs, or any other suitable ISA. In multiprocessor systems, each of processors 1210 may commonly, but not necessarily, implement the same ISA.

System memory 1230 may be configured to store instructions and data accessible by processor(s) 1210. In various embodiments, system memory 1230 may be implemented using any suitable memory technology, such as static random access memory (SRAM), synchronous dynamic RAM (SDRAM), nonvolatile/Flash-type memory, or any other type of memory.

In one embodiment, I/O interface 1250 may be configured to coordinate I/O traffic between processor 1210, system memory 1230, and any peripheral devices in the device, including network interface 1260 or other peripheral interfaces. In some embodiments, I/O interface 1250 may perform any necessary protocol, timing, or other data transformations to convert data signals from one component (e.g., system memory 1230) into a format suitable for use by another component (e.g., processor 1210). In some embodiments, I/O interface 1250 may include support for devices attached through various types of peripheral buses, such as a variant of the Peripheral Component Interconnect (PCI) bus standard or the Universal Serial Bus (USB) standard, for example. In some embodiments, the function of I/O interface 1250 may be split into two or more separate components, such as a north bridge and a south bridge, for example. Also, in some embodiments some or all of the functionality of I/O interface 1250, such as an interface to system memory 1230, may be incorporated directly into processor 1210.

Network interface 1260 may be configured to allow data to be exchanged between computing device 1200 and other device or devices attached to a network or network(s), such as other computer systems or devices as illustrated in FIG. 1, for example. In various embodiments, network interface 1260 may support communication via any suitable wired or wireless general data networks, such as types of Ethernet networks, for example. Additionally, network interface 1260 may support communication via telecommunications/telephony networks such as analog voice networks or digital fiber communications networks, via storage area networks such as Fibre Channel SANs or via any other suitable type of network and/or protocol.

In some embodiments, system memory 1230 may be one embodiment of a computer-accessible medium configured to store program instructions and data as described above for implementing embodiments of the corresponding methods and apparatus. However, in other embodiments, program instructions and/or data may be received, sent or stored upon different types of computer-accessible media. Generally speaking, a computer-accessible medium may include non-transitory storage media or memory media, such as magnetic or optical media, e.g., disk or DVD/CD coupled to computing device 1200 via I/O interface 1250. A non-transitory computer-accessible storage medium may also include any volatile or non-volatile media, such as RAM (e.g. SDRAM, DDR SDRAM, RDRAM, SRAM, etc.), ROM, etc., that may be included in some embodiments of computing device 1200 as system memory 1230 or another type of memory.

Further, a computer-accessible medium may include transmission media or signals such as electrical, electromagnetic or digital signals, conveyed via a communication medium such as a network and/or a wireless link, such as may be implemented via network interface 1260. Portions or all of multiple computing devices may be used to implement the described functionality in various embodiments; for example, software components running on a variety of different devices and servers may collaborate to provide the functionality. In some embodiments, portions of the described functionality may be implemented using storage devices, network devices, or special-purpose computer systems, in addition to or instead of being implemented using general-purpose computer systems. The term "computing device," as used herein, refers to at least all these types of devices and is not limited to these types of devices.

Each of the processes, methods, and algorithms described in the preceding sections may be embodied in, and fully or partially automated by, code modules executed by one or more computers or computer processors. The code modules may be stored on any type of non-transitory computer-readable medium or computer storage device, such as hard drives, solid state memory, optical disc, and/or the like. The processes and algorithms may be implemented partially or wholly in application-specific circuitry. The results of the disclosed processes and process steps may be stored, persistently or otherwise, in any type of non-transitory computer storage such as, e.g., volatile or non-volatile storage.

The various features and processes described above may be used independently of one another, or may be combined in various ways. All possible combinations and sub-combinations are intended to fall within the scope of this disclosure. In addition, certain method or process blocks may be omitted in some implementations. The methods and processes described herein are also not limited to any particular sequence, and the blocks or states relating thereto can be performed in other sequences that are appropriate. For example, described blocks or states may be performed in an order other than that specifically disclosed, or multiple blocks or states may be combined in a single block or state. The example blocks or states may be performed in serial, in parallel or in some other manner. Blocks or states may be added to or removed from the disclosed example embodiments. The example systems and components described herein may be configured differently than described. For example, elements may be added to, removed from, or rearranged compared to the disclosed example embodiments.

It will also be appreciated that various items are illustrated as being stored in memory or on storage while being used, and that these items or portions of thereof may be transferred between memory and other storage devices for purposes of memory management and data integrity. Alternatively, in other embodiments some or all of the software modules and/or systems may execute in memory on another device and communicate with the illustrated computing systems via inter-computer communication. Furthermore, in some embodiments, some or all of the systems and/or modules may be implemented or provided in other ways, such as at least partially in firmware and/or hardware, including, but not limited to, one or more application-specific integrated circuits (ASICs), standard integrated circuits, controllers (e.g., by executing appropriate instructions, and including microcontrollers and/or embedded controllers), field-programmable gate arrays (FPGAs), complex programmable logic devices (CPLDs), etc. Some or all of the modules, systems and data structures may also be stored (e.g., as software instructions or structured data) on a computer-readable medium, such as a hard disk, a memory, a network, or a portable media article to be read by an appropriate drive or via an appropriate connection. The systems, modules, and data structures may also be transmitted as generated data signals (e.g., as part of a carrier wave or other analog or digital propagated signal) on a variety of computer-readable transmission media, including wireless-based and wired/cable-based media, and may take a variety of forms (e.g., as part of a single or multiplexed analog signal, or as multiple discrete digital packets or frames). Such computer program products may also take other forms in other embodiments. Accordingly, the present invention may be practiced with other computer system configurations.

Conditional language used herein, such as, among others, "could," "might," "may," "e.g.," and the like, unless specifically stated otherwise, or otherwise understood within the context as used, is generally intended to convey that certain embodiments include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without author input or prompting, whether these features, elements, and/or steps are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

While certain example embodiments have been described, these embodiments have been presented by way of example only, and are not intended to limit the scope of the inventions disclosed herein. Thus, nothing in the foregoing description is intended to imply that any particular feature, characteristic, step, module, or block is necessary or indispensable. Indeed, the novel methods and systems described herein may be embodied in a variety of other forms; furthermore, various omissions, substitutions and changes in the form of the methods and systems described herein may be made without departing from the spirit of the inventions disclosed herein. The accompanying claims and their equivalents are intended to cover such forms or modifications as would fall within the scope and spirit of certain of the inventions disclosed herein.

What is claimed is:

1. A method of improving accuracy of weather forecast data provided by an existing forecast provider, comprising:
receiving a first set of data indicative of future weather conditions for a plurality of areas provided by the existing forecast provider, wherein the existing forecast provider provides weather forecast data only;

generating a second set of data indicative of future weather conditions for a plurality of locations based at least on the received first set of data using a local weather forecast model, wherein the local weather forecast model is based at least on a correlation between the weather forecast data provided by the existing forecast provider and data gathered by a plurality of data collection devices, wherein the local weather forecast model has been trained using historical weather forecast data provided by the existing forecast provider and historical data gathered by the plurality of data collection devices, and wherein the plurality of data collection devices are associated with the plurality of locations;

temporally interpolating the second set of data and generating a third set of data indicative of higher-frequency future weather forecasts for the plurality of locations; and spatially interpolating the second set of data and generating a fourth set of data indicative of future weather conditions for other locations than the plurality of locations.

2. The method of claim 1, further comprising:
mapping the plurality of locations to their corresponding areas among the plurality of areas.

3. The method of claim 1, further comprising:
updating the second set of data, the third set of data, and the fourth set of data in response to receiving a latest set of data indicative of future weather conditions provided by the existing forecast provider.

4. The method of claim 1, further comprising:
evaluating forecast accuracy of the local weather forecast model using a set of test data.

5. The method of claim 1, wherein the plurality of data collection devices each are capable of capturing images indicative of a sky portion at a corresponding location among the plurality of locations and measuring data using a plurality of sensors, and the captured images and the measured data are associated with their corresponding locations and timestamps.

6. The method of claim 5, wherein information indicative of cloud type, cloud moving direction, and cloud cover is extracted from the images.

7. The method of claim 5, wherein information relating to cloud type is extracted from the images by a deep learning algorithm, and the deep learning algorithm is trained using pre-labelled information relating to a plurality of cloud types.

8. A system of improving accuracy of weather forecast data provided by an existing forecast provider, comprising:
a processor: and
a memory communicatively coupled to the processor to configure the processor at least to:
receive a first set of data indicative of future weather conditions for a plurality of areas provided by the existing forecast provider, wherein the existing forecast provider provides weather forecast data only;
generate a second set of data indicative of future weather conditions for a plurality of locations based at least on the received first set of data using a local weather forecast model, wherein the local weather forecast model is based at least on a correlation between the weather forecast data provided by the existing forecast provider and data gathered by a plurality of data collection devices, wherein the local weather forecast model has been trained using historical weather forecast data provided by the existing forecast provider and historical data gathered by the plurality of data collection devices, and wherein the plurality of data collection devices are associated with the plurality of locations;

temporally interpolate the second set of data and generate a third set of data indicative of higher-frequency future weather forecasts for the plurality of locations; and spatially interpolate the second set of data and generate a fourth set of data indicative of future weather conditions for other locations than the plurality of locations.

9. The system of claim 8, the memory further configuring the processor at least to:
map the plurality of locations to their corresponding areas among the plurality of areas.

10. The system of claim 8, the memory further configuring the processor at least to:
update the second set of data the third set of data, and the fourth set of data in response to receiving a latest set of data indicative of future weather conditions provided by the existing forecast provider.

11. The system of claim 8, the memory further configuring the processor at least to:
evaluate forecast accuracy of the local weather forecast model using a set of test data.

12. The system of claim 8, wherein the plurality of data collection devices each are capable of capturing images indicative of a sky portion at a corresponding location among the plurality of locations and measuring data using a plurality of sensors, and the captured images and the measured data are associated with their corresponding locations and timestamps.

13. The system of claim 12, wherein information relating to cloud type, cloud moving direction and cloud cover is extracted from the images.

14. The system of claim 12, wherein information relating to cloud type is extracted from the images by a deep learning algorithm, and the deep learning algorithm is trained using pre-labelled information relating to a plurality of cloud types.

15. A non-transitory computer-readable storage medium bearing computer-readable instructions that upon execution on a computing device cause the computing device at least to:
receive a first set of data indicative of future weather conditions for a plurality of areas provided by an existing forecast provider, wherein the existing forecast provider provides weather forecast data only;
generate a second set of data indicative of future weather conditions for a plurality of locations based at least on the received first set of data using a local weather forecast model, wherein the local weather forecast model is based at least on a correlation between the weather forecast data provided by the existing forecast provider and data gathered by a plurality of data collection devices, wherein the local weather forecast model has been trained using historical weather forecast data provided by the existing forecast provider and historical data gathered by the plurality of data collection devices, and wherein the plurality of data collection devices are associated with the plurality of locations:
temporally interpolate the second set of data and generate a third set of data indicative of higher-frequency future weather forecasts for the plurality of locations; and spatially interpolate the second set of data and generate a fourth set of data indicative of future weather conditions for other locations than the plurality of locations.

16. The non-transitory computer-readable storage medium of claim 15, further comprising computer-readable instructions that upon execution on the computing device cause the computing device at least to:

map the plurality of locations to their corresponding areas among the plurality of areas.

17. The non-transitory computer-readable storage medium of claim 15, further comprising computer-readable instructions that upon execution on the computing device cause the computing device at least to:

update the second set of data, the third set of data, and the fourth set of data in response to receiving a latest set of data indicative of future weather conditions provided by the existing forecast provider.

18. The non-transitory computer-readable storage medium of claim 15, further comprising computer-readable instructions that upon execution on the computing device cause the computing device at least to:

evaluate forecast accuracy of the local weather forecast model using a set of test data.

19. The non-transitory computer-readable storage medium of claim 15, wherein the plurality of data collection devices each are capable of capturing images indicative of a sky portion at a corresponding location among the plurality of locations and measuring data using a plurality of sensors, and the captured images and the measured data are associated with their corresponding locations and timestamps.

20. The non-transitory computer-readable storage medium of claim 19, wherein information relating to cloud type is extracted from the images by a deep learning algorithm, and the deep learning algorithm is trained using pre-labelled information relating to a plurality of cloud types.

* * * * *